United States Patent
Lopez et al.

(10) Patent No.: US 10,109,614 B2
(45) Date of Patent: Oct. 23, 2018

(54) SILICON PACKAGE FOR EMBEDDED ELECTRONIC SYSTEM HAVING STACKED SEMICONDUCTOR CHIPS

(71) Applicant: Texas Instruments Incorporated, Dallas, TX (US)

(72) Inventors: Osvaldo Jorge Lopez, Annandale, NJ (US); Jonathan Almeria Noquil, Bethlehem, PA (US); Thomas Eugene Grebs, Bethlehem, PA (US); Simon John Molloy, Allentown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/053,089

(22) Filed: Feb. 25, 2016

(65) Prior Publication Data
US 2016/0172338 A1    Jun. 16, 2016

Related U.S. Application Data

(62) Division of application No. 14/537,943, filed on Nov. 11, 2014, now Pat. No. 9,305,852.

(51) Int. Cl.
*H01L 25/065* (2006.01)
*H01L 23/06* (2006.01)
(Continued)

(52) U.S. Cl.
CPC .......... *H01L 25/0657* (2013.01); *H01L 21/50* (2013.01); *H01L 23/053* (2013.01);
(Continued)

(58) Field of Classification Search
None
See application file for complete search history.

(56) References Cited

U.S. PATENT DOCUMENTS 4,568,958 A * 2/1986 Baliga .................. H01L 29/205
                                                          257/332
2012/0101540 A1    4/2012 O'Brien et al.
(Continued)

FOREIGN PATENT DOCUMENTS

WO    2006084177 A2    8/2006
WO    2012021310 A1    2/2012

OTHER PUBLICATIONS

Notification of Transmittal of the International Search Report and the Written Opinion of the International Searching Authority, or the Declaration; dated Mar. 17, 2016.

*Primary Examiner* — Long Pham
(74) *Attorney, Agent, or Firm* — Dawn Jos; Charles A. Brill; Frank D. Cimino

(57) ABSTRACT

An electronic system comprises a first chip of single-crystalline semiconductor shaped as a hexahedron and including a first electronic device embedded in a second chip of single-crystalline semiconductor shaped as a container having a slab bordered by retaining walls, and including a second electronic device. The container shaped as a slab bordered by the retaining walls and including conductive traces and terminals. The first chip is attached to the slab of second chip, forming nested chips. The first and second chips embedded in the container. The nested first and second chips are operable as an electronic system and the container is operable as the package of the system.

17 Claims, 8 Drawing Sheets

(51) Int. Cl.
  *H01L 25/18* (2006.01)
  *H01L 25/00* (2006.01)
  *H01L 23/053* (2006.01)
  *H01L 23/00* (2006.01)
  *H01L 21/50* (2006.01)
  *H01L 23/13* (2006.01)
  *H01L 23/14* (2006.01)
  *H01L 29/06* (2006.01)
  *H01L 23/498* (2006.01)

(52) U.S. Cl.
  CPC .............. *H01L 23/06* (2013.01); *H01L 23/13* (2013.01); *H01L 23/147* (2013.01); *H01L 24/83* (2013.01); *H01L 24/97* (2013.01); *H01L 25/18* (2013.01); *H01L 25/50* (2013.01); *H01L 29/0657* (2013.01); *H01L 23/49844* (2013.01); *H01L 2224/06181* (2013.01); *H01L 2224/83851* (2013.01); *H01L 2224/97* (2013.01); *H01L 2225/00* (2013.01); *H01L 2225/06513* (2013.01); *H01L 2225/06517* (2013.01); *H01L 2225/06555* (2013.01); *H01L 2225/06589* (2013.01); *H01L 2924/01013* (2013.01); *H01L 2924/01014* (2013.01); *H01L 2924/01022* (2013.01); *H01L 2924/01028* (2013.01); *H01L 2924/01079* (2013.01); *H01L 2924/04642* (2013.01); *H01L 2924/04941* (2013.01); *H01L 2924/05042* (2013.01); *H01L 2924/05442* (2013.01); *H01L 2924/1032* (2013.01); *H01L 2924/1033* (2013.01); *H01L 2924/1037* (2013.01); *H01L 2924/10155* (2013.01); *H01L 2924/10253* (2013.01); *H01L 2924/10271* (2013.01); *H01L 2924/10329* (2013.01); *H01L 2924/1305* (2013.01); *H01L 2924/13091* (2013.01); *H01L 2924/1425* (2013.01); *H01L 2924/1427* (2013.01); *H01L 2924/157* (2013.01); *H01L 2924/15156* (2013.01)

(56) References Cited

U.S. PATENT DOCUMENTS

| | | | |
|---|---|---|---|
| 2014/0145643 A1* | 5/2014 | Bannister | H05B 33/0812 315/294 |
| 2014/0171822 A1* | 6/2014 | O'Brien | A61B 5/0031 600/549 |
| 2015/0162264 A1 | 6/2015 | Chang et al. | |

* cited by examiner

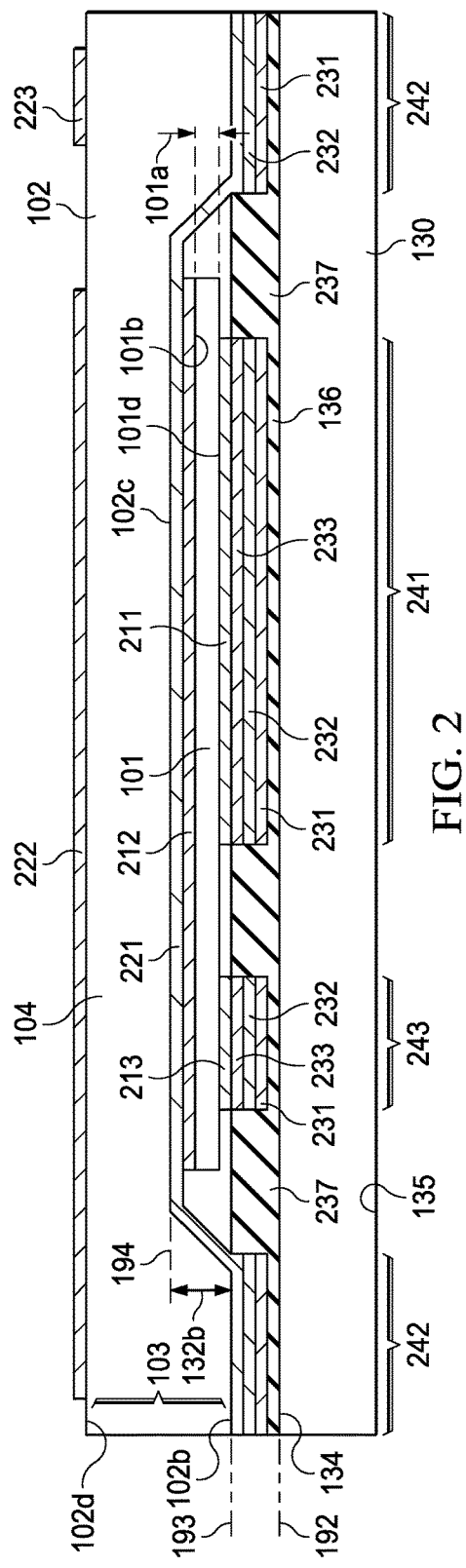
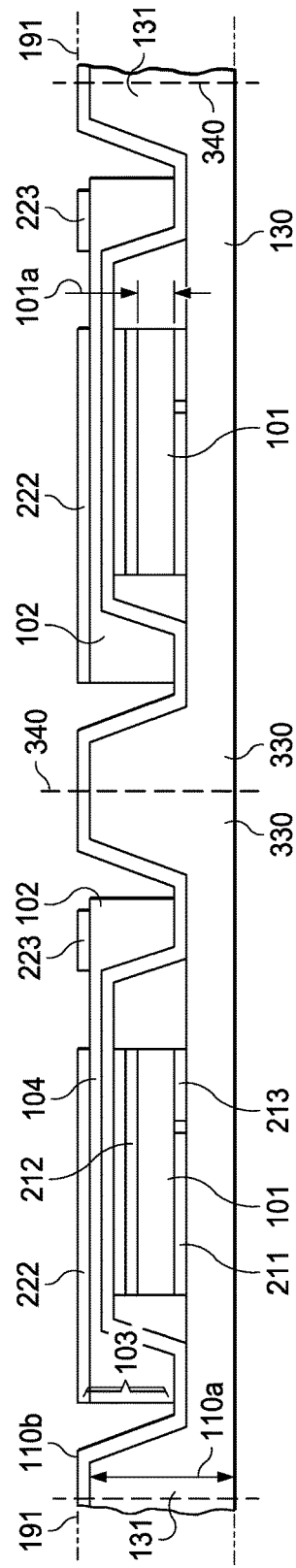
FIG. 2
FIG. 3

SILICON PACKAGE FOR EMBEDDED ELECTRONIC SYSTEM HAVING STACKED SEMICONDUCTOR CHIPS

CROSS-REFERENCE TO RELATED APPLICATION

This application is a Divisional of and claims priority to U.S. patent application Ser. No. 14/537,943, filed on Nov. 11, 2014, which is hereby incorporated herein by reference.

FIELD

The embodiments of the invention are related in general to the field of semiconductor devices and processes, and more specifically to the structure and wafer-scale fabrication method of a low-grade silicon package for embedded semiconductor power block and half bridge devices.

DESCRIPTION OF RELATED ART

In the majority of today's semiconductor devices, the semiconductor chip is typically assembled on a substrate such as a metallic leadframe or a multi-level laminate, and encapsulated in a package of a robust material such as ceramic or hardened plastic compound. The assembly process typically includes the process of attaching the chip to a substrate pad or the leadframe pad, and the process of connecting the chip terminals to substrate leads using bonding wires or solder balls.

The use of widely different materials such as metals, ceramics, and plastics cause challenges not only for mutual parts adhesion, but also for long-term device stability; an example is delamination of adjacent parts. For plastic-packaged semiconductor devices, extensive research has been dedicated to identify corrective measures for device reliability issues caused by thermo-mechanical stress due to material-based mismatches of the coefficients of thermal expansion; degradation due to stress effects could so far only be mitigated but not eliminated. In addition, moisture-related degradation of electrical characteristics in plastic-encapsulated devices has been well documented, but has been brought under control only to a certain degree. Much effort has further been extended to prevent the onset of fatigue and cracking in metallic connections in devices after operational temperature excursions, again only with limited success.

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit. In some recently introduced advanced assemblies, clips substitute for many connecting wires. These clips are wide and introduce minimum parasitic inductance, but are more expensive than wire bonds and require a more involved assembly process. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack, with the physically larger-area chip of the two attached to the leadframe pad, and with clips providing the connections to the switch node and the stack top. Independent of the physical size, the sync FET chip needs a larger active area than the active area of the control FET chip, due to considerations of duty cycle and conduction loss. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$; a clip is connected to the switch node between the two chips. The pad is at ground potential and serves as a spreader of operationally generated heat; the elongated clip of the stack top is tied to input supply $V_{IN}$.

SUMMARY

Applicants realized that a radically new approach was needed in order to significantly improve semiconductor transistor devices, power blocks and power converters with respect to reducing parasitic resistances and inductances, improving thermal performances and speed, enhancing operational reliability in moist and temperature-variable ambient, and reducing manufacturing cost. The conventional composite package, where semiconductor chips are assembled on a metallic carrier and packaged in a plastic encapsulation, combines materials of widely different coefficients of thermal expansion, leading to a propensity for thermo-mechanical stresses, and requires a lengthy, time-consuming and costly fabrication flow.

Applicants further realized that the market trend, especially for automotive and hand-held applications, requires ever more miniaturized semiconductor products. As an example, this trend favors for DC-DC converters structures, wherein the semiconductor chips are stacked on top of each other in order to save precious real estate, rather than assembled side by side.

Applicants solved the materials and cost problems of a semiconductor package, when they discovered a structure concept and manufacturing flow for packages, which adopts and parallels the mass production and controlled processes of routine semiconductor wafer manufacturing. The new package is based on using silicon slabs cut from wafers made of low-grade and thus low cost silicon, which can be obtained, for instance, from reclaimed, unrefined, and undoped silicon. While processed in wafer form, a slab obtains a depression suitable for assembling a single-crystal device chip, and can acts as a carrier as well as the final package.

The new package concept eliminates leadframes, bonding wires, metallic clips, solder balls, and plastic, ceramic, and metallic housings. Instead, the fabrication processes use tried-and-true front-end techniques such as etching semiconductors, metals, and insulators, depositing layers of metals, insulators, and passivation, growing insulating layers, and patterning by photoresist technologies.

In addition, applicants solved the assembly problem of stacking chips without clips, when they discovered a concept and manufacturing flow for chips with completed transistors or circuits, which include the etching of depressions into the completed chips having contours and depth for embedding smaller chips into the depression.

The resulting devices no longer suffer from mismatched coefficients of thermal expansion, but instead allow the minimization of thermo-mechanical stresses. In addition, parasitic resistances and inductances are reduces since wire bonds and clips are eliminated. Thermal conductivity and thus electrical performance of the new devices is enhanced by attaching the chips of the finished devices directly onto circuit boards. In addition, the resulting power blocks and power converters with stacked and embedded chips allow concurrent device miniaturization in x-, y-, and z-dimension.

BRIEF DESCRIPTION OF THE DRAWINGS

FIG. 2 shows a cross section of the assembled system of FIG. 1 along line A-A.

FIG. 3 depicts a cross section of a portion of a low-grade-silicon (L-g-Si) wafer with stacked MOSFET chips of a power attached and embedded.

DETAILED DESCRIPTION OF THE PREFERRED EMBODIMENTS

Figure 1:
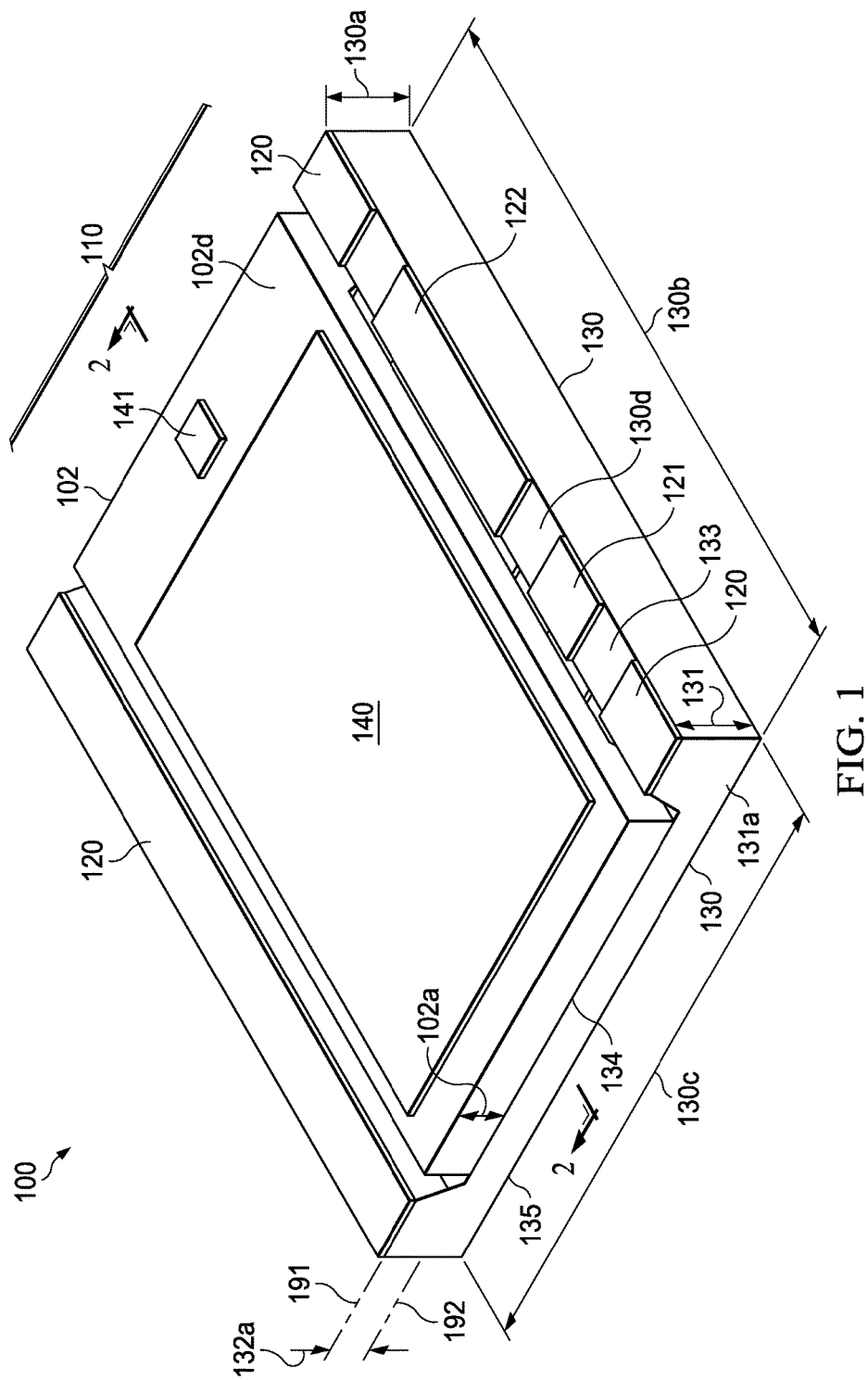
FIG. 1 illustrates a perspective view of an embodiment of the invention, a power block with stacked silicon MOS field effect transistors (FETs) flip-attached to and embedded in a silicon package.

FIG. 1 illustrates system 100 as an exemplary embodiment of the invention, a power block 110 embedded into, and attached to, a container of low-grade silicon (l-g-Si) including a slab 130 and ridges, or retaining walls, 131. The container not only exhibits certain terminals of the system but also operates as the system package. FIG. 2 shows a cross section through power block 101 along lines 2-2; the cross section illustrates the attachments of the transistor chips and the layer sequence of metals and insulators. FIG. 3 depicts a cross section through a plurality of packaged systems after completing the assembly yet before sawing the wafer of low-grade silicon into discrete packaged systems.

Referring now to the example of FIG. 1, slab 130 has a flat surface 135 and is made of low-grade silicon, wherein the low-grade silicon (I-g-Si) is selected from a group including, but not limited to, reclaimed silicon, unrefined silicon, undoped silicon, polycrystalline silicon, intrinsic polycrystalline silicon, lowly doped n-type polycrystalline silicon, and lowly doped p-type polycrystalline silicon. In other embodiments, the I-g-Si material may be heavily doped in order to obtain low resistivity. In the example of FIG. 1, slab 130 has a thickness 130a of about 300 μm, a length 130b of about 5.8 mm, and a width 130c of about 3.7 mm. Thickness 130a is herein referred to as first thickness. The material of the I-g-Si slab is exposed at the edges 131a of the slab; the slab top proper, viewed in FIG. 1, is made of a first insulating layer 133, which determines first plane 191. Portions of the insulating layer are exposed at certain locations, while other portions are covered by a metal layer, which is configured as terminals 120 (for instance, switch node of the power block), terminal 121 (for instance, gate of the high side FET), and terminal 122 (for instance, drain of the high side FET tied to input supply $V_{IN}$) of system 100. The insulating surface of the slab is called herein first surface 130d; the first surface is in a first plane 191.

Figure 8:
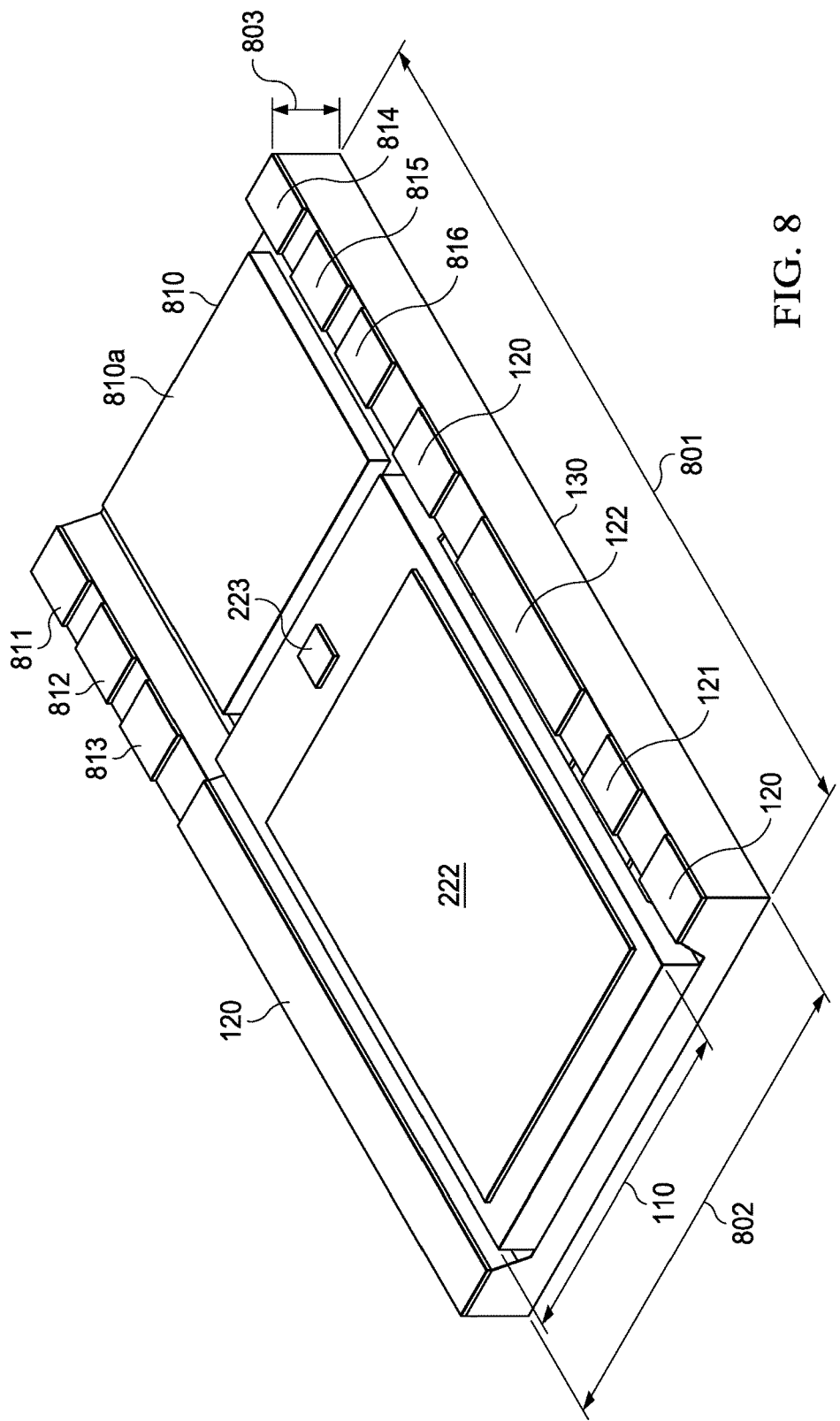
FIG. 8 depicts a perspective view of an assembled power converter with stacked MOS FETs and an adjacent driver-and-controller chip embedded in the depression etched into a I-g-Si slab operating as package.

As FIG. 1 shows, slab 130 is configured as a set of elevated ridges 131 with the top surface 130d in plane 191 so that the ridges are framing a depression. In FIG. 1, the system has two parallel ridges; in other embodiments, the system may have more ridges. The depression includes a recessed central area with a surface 134 in a second plane 191; surface 134 is covered by a second insulating layer 136. The central area is suitable to accommodate at least semiconductor chip 102; another embodiment is shown in FIG. 8, where the central area is suitable to accommodate more than one chip. FIG. 1 illustrates that the surface of the central area is in a second plane 192, which is spaced from the first plane 191 by depression depth 132a, which is referred to herein as first depth. Preferably, first depth 132a is equal to the sum of the chip thickness 102a and the thickness of the adhesive material used to attach chip 102 to the recessed central area. In the example of FIG. 1, first depth 132a may be about 64 μm. As depicted in later figures, the central area is covered by a patterned metal layer configured as attachment pads for the device terminals such as transistor terminals; as FIGS. 2 and 3 show, the pads of the central area are grouped into an inner set and a peripheral set.

The portion of power block 110 visible in FIG. 1 is semiconductor chip 102, which is referred to herein as second chip (first chip 101 is illustrated in FIGS. 2 and 3). In the example of FIG. 1, chip 102 is made of heavily doped single-crystalline silicon, which allows direct contact to a metal layer often referred to as back metal. The doped silicon is topped by an epitaxial layer of intrinsic silicon, which includes a drain-down MOS field effect transistor (FET) serving as the low side transistor of the power block and is herein referred to as the second semiconductor chip. Chip 102 has a thickness 102a, which may for instance be about 50 µm; thickness 102a is herein referred to as third thickness. Third thickness 102a is smaller than first thickness 130a, but greater than second thickness 101a (which is depicted in FIGS. 2 and 3 as the thickness of the first semiconductor chip 101). Chip 102 has a flat side 102d, which is visible in FIG. 1; flat side 102d is referred to herein as the third side.

The exemplary MOS FET of FIG. 1 has its source terminal 140 and gate terminal 141 on the third side facing away from slab 130. Source terminal 140 is electrically tied to ground potential. In other embodiments, the semiconductor chip may be made of, for example, silicon-germanium, gallium arsenide, gallium nitride, or other III-V and II-VI compounds used as semiconductor device materials. In yet other embodiments, the drain terminal may be facing away from the slab. In still other embodiments, the transistor may be a bipolar transistor having the collector contact facing away from the slab; or the bipolar transistor may have the emitter terminal facing away from the slab.

Since FIG. 2 shows a cross section of system 100 along lines 2-2 in FIG. 1, the ridges of slab 130 are not represented; FIG. 2 rather shows the flat surface 135 of the slab and the flat surface 134 of the recessed central area, which is in the second plane 192. FIG. 2 further displays a first semiconductor chip 101 and a second semiconductor chip 102, which may be larger than first chip 101. Both chips are made of a single-crystalline semiconductor material, which may for instance be silicon. For second chip 102, FIG. 2 indicates flat side 102d, which is referred to herein as third side. FIG. 2 further illustrates that chip 102 has a fourth side 102b, which is contoured. The contour of fourth side 102b is configured as a set of ridges 103 with a surface in third plane 193; ridges 103 frame a depression. In FIG. 2, chip 102 has two parallel ridges; in other embodiments, chip 102 may have more ridges. The depression includes a recessed flat central area with a surface 102c in a fourth plane 194 parallel to plane 193. The central area is suitable to accommodate first chip 101, which is thus embedded in second chip 102. FIG. 1 illustrates that fourth plane 194 is spaced from the third plane 193 by a second depth 132b smaller than the first depth 132a and suitable to accommodate the thickness of first chip 101 with its metal layers and layers of attachment material.

FIG. 2 indicates that fourth side 102b including surface 102c of chip 102 is uniformly covered by a metal layer 221, which is sometimes referred to as back metal. Preferably, layer 221 includes a layer of refractory metal (such as titanium or tungsten) for adhesion to the semiconductor crystal, followed by a layer of nickel and an outermost layer of a noble metal (such as silver, palladium, or gold). In some products, the refractory metal layer is omitted. Portions of the third side 102d of chip 102 also have a sequence of stacked layers of similar metal selections, for example titanium, nickel, and silver, or just nickel and gold. The stacked metal layers are patterned into pads 222 and 223.

In the exemplary embodiment of FIG. 2, chip 102 includes a field effect transistor (FET), which serves as the low-side FET of the power block. As mentioned, the bulk single-crystal silicon of chip 102 is heavily doped and makes good contact to the so-called back metal layer 221. In this example of FIG. 2, the metallized fourth chip side 102b with metal layer 221 serves as the drain terminal of the low-side FET, electrically tied to the switch node, pad 222 is the source terminal electrically tied to ground potential, and pad 223 the gate terminal of the low-side FET. As FIG. 2 shows, the fourth chip side 102b of chip 102 includes the ridges and the central area, which is depressed relative to the ridges.

Based on its smaller size and thickness, first chip 101 is embedded in the depression of second chip 102. As stated, first chip 101 is made of a single-crystalline semiconductor material, which may for instance be silicon. In contrast to second chip 102, both first side 101d and second side 101b of first chip 101 are flat. First chip 101 has thickness 101a, which is smaller than second depth 132b so that first chip 101 together with its metal layers and attachment layers can be embedded in the depressed central area of second chip 102.

In the exemplary embodiment of FIG. 2, chip 101 includes a field effect transistor (FET), which serves as the high-side FET of the power block and has terminals on the first and the second chip side. In this example, the metal pad 211 of first chip side 101d serves as the drain terminal of the high-side FET, electrically tied to the input supply $V_{IN}$, and pad 213 is the gate terminal of the high-side FET.

As FIG. 2 illustrates, the I-g-Si material of slab 130 is covered by an insulating layer 136, preferably thermally grown silicon dioxide. (The fact that in some places the insulating layer has increased thickness is a secondary effect of the patterning of the metal layer, discussed by the process flow below.) Insulating layer 136, in turn, is covered by a metal layer. While one metal layer may be sufficient, FIG. 2 illustrates a preferred method of a sequence of metal layers. The first layer 231 is made of a refractory metal such as titanium, followed by a compound layer such as titanium nitride. Alternative choices include a layer of tungsten, or titanium-tungsten, or another refractory metal. The refractory metal adheres strongly to insulating layer 136. Then, a layer 232 of aluminum is deposited onto the refractory metal layer; layer 232 is preferably thicker than layer 231. For some applications, it is preferred to deposit a layer of nickel and a thin layer of gold (both layers designated 233 in FIG. 2) on top or the aluminum layer 232 in order to facilitate the attachment of transistor terminals.

The metal layers 231 and 232 (and optional 233) are patterned in the depressed central area of slab 130. The result of the patterning is a plurality of pads grouped into an inner set and a peripheral set. The pads of the inner set match the terminals of the transistors of the first chip 101, and the pads of the peripheral set match the terminals of the ridges of second chip 102. For the first chip 101 of FIG. 2, the patterned metal pads of the inner set include the drain terminal 241 and the gate terminal 243 of the high-side FET. For the second chip 102 of FIG. 2, the patterned metal pads of the peripheral set include the switch node terminals 242 of the power block, which combines the source terminal of the high-side FET and the drain terminal of the low-side FET.

FIG. 3 depicts a portion of a I-g-Si wafer 330 with a plurality of slab sites after completing the assembly of first and second FET chips in each slab site. As FIG. 3 shows, for each slab site the assembly encompasses a first chip 101 embedded in the depression of a second chip 102 and, in turn, the second chip embedded in the depression of a respective slab. Second chip 102 is formed as a container including a slab 104 bordered by ridges 103. The embedded positions imply that the metallized depressed central area of the fourth side of second chip 102 is attached to the terminals on the second side of the first chip, and the metallized ridges of the second chip attached to the pads of the peripheral set of the central I-g-Si area, whereby the transistor terminals on the third side of the second chip are co-planar with the metal layer on the ridges of the respective I-g-Si slab. In FIG. 3, the plane of co-planarity is designated 191; it is referred to herein as first plane.

In FIG. 3, the cut lines through the wafer for separating the slab sites are marked 340. After singulation, a discrete system looks as system 100 depicted in FIG. 1. Metal layer 222 as the source terminal 140 and metal layer 223 as the gate terminal 141 are ready for attachment to external parts, when system 100 is connected to a circuit board.

Figure 9:
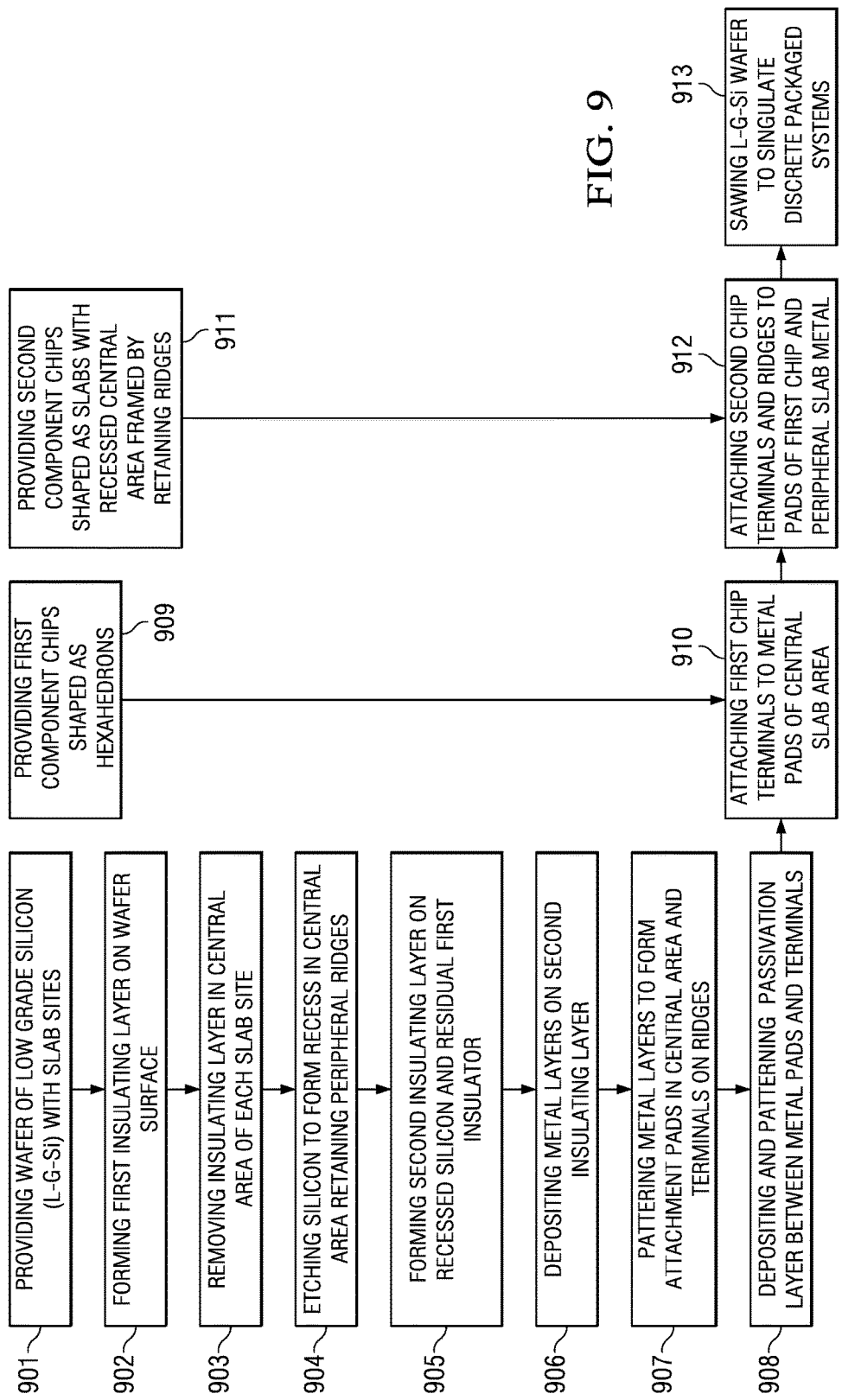
FIG. 9 is a flow chart of the method for fabricating an electronic system with stacked component chips embedded in a silicon package.

Another embodiment of the invention is a method of fabricating semiconductor slabs bordered by retaining walls suitable as device packages, and a method of fabricating a packaged electronic system using a silicon slab as a package for semiconductor devices. Certain processes are summarized in FIGS. 4, 5A, 5B, 6 and 7. An overview of the process flow for fabricating an electronic system with stacked chips embedded in a silicon package is presented in the flow chart of FIG. 9. The process flow of fabricating semiconductor slabs starts with providing a wafer of low-grade silicon (I-g-Si), which includes a plurality of slab sites (process 901). The wafer has two parallel flat surfaces, one of which is referred to as first surface. The preferred wafer diameter is 300 mm, but smaller diameters may be used; the plane of the first surface is referred to as first plane 191. While it is preferred that the final wafer before dicing has a thickness 130a (referred to as first thickness) of about 300 µm, it is practical to execute the preceding process steps using a thicker wafer and obtain the final thickness by back-grinding. Consequently, designation 110a of FIG. 3 intends to indicate such wafer thickness greater than 130a. The I-g-Si may be selected from a group including reclaimed silicon, unrefined silicon, undoped silicon, polycrystalline silicon, and intrinsic polycrystalline silicon. For devices with transistor terminals isolated from the slab, the I-g-Si material may also include lowly doped n-type polycrystalline silicon and lowly doped p-type polycrystalline silicon. On the other hand, for devices with transistor terminals shorted to the slab, the I-g-Si material may also include low resistivity n-type polycrystalline silicon and low resistivity p-type polycrystalline silicon.

In the next process for either I-g-Si choice, a first insulating layer 133 is formed on the first surface of the wafer (process 902); the layer covers all slab sites. The preferred technique of forming an insulating surface layer is thermally oxidizing the silicon. Alternative techniques include depositing a layer of silicon dioxide, silicon nitride, silicon carbide, or a combination thereof, and depositing an insulating compound different from a silicon compound.

Then, the first insulating layer is removed from the central portion of each slab site to expose the underlying I-g-Si, while leaving un-removed the first insulating layer 133 over the peripheral site portions to form ridges framing each central portion (process 903). The ridges are sometimes referred to as retaining walls or rims bordering the central portion.

Figure 4:
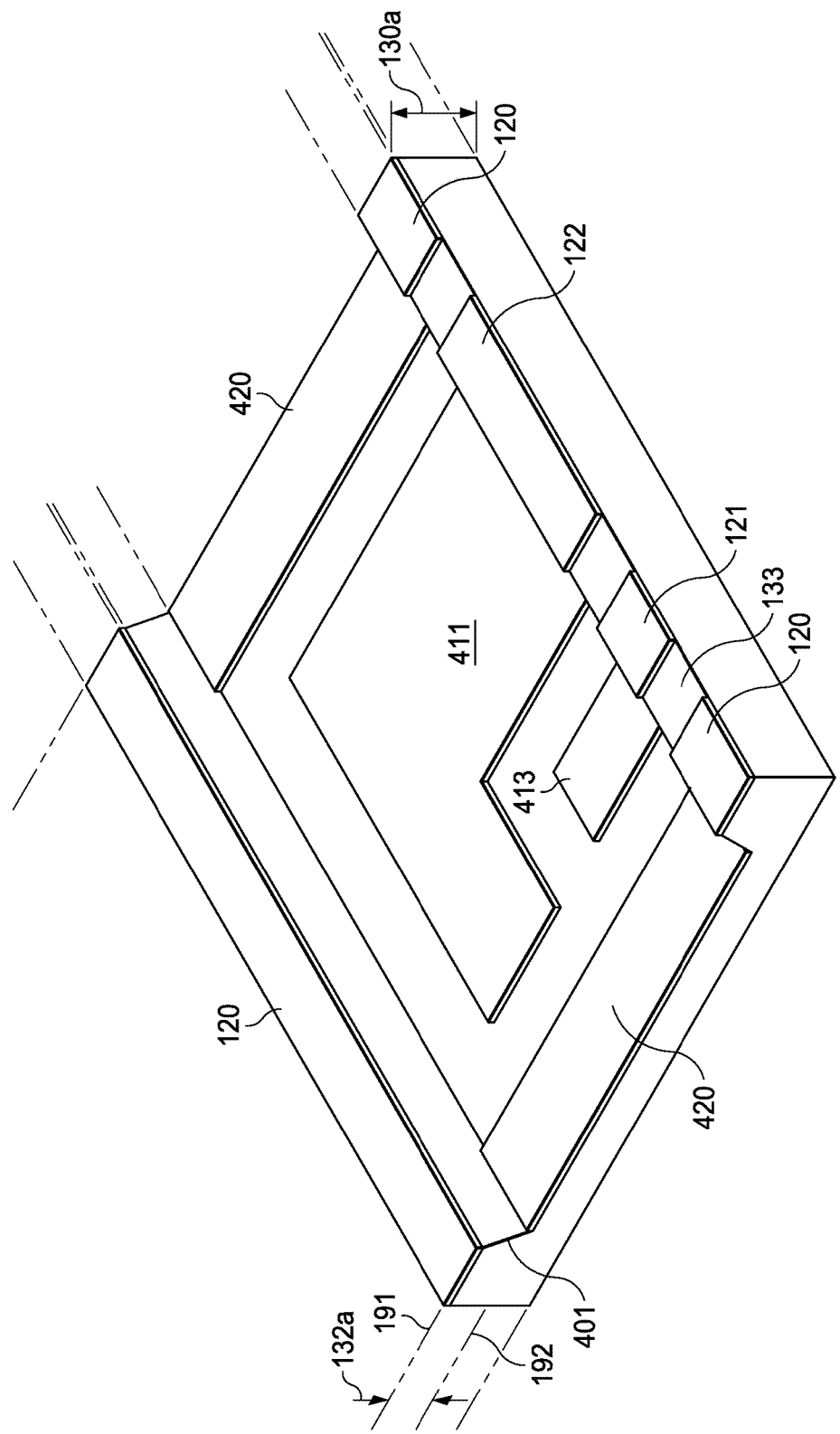
FIG. 4 illustrates a perspective view of a site of a I-g-Si wafer after etching and metallizing a depression suitable for assembling stacked chips for a power block.

In the next process (process 904), the exposed I-g-Si of the central area of each slab site is etched, for instance using KOH, to create a depression with a second I-g-Si surface having a flat central portion in a second plane 192 recessed from the first plane by a depth 132a. Referring now to FIG. 4, the figure depicts an individual slab site at a processing state, which summarizes the results of the above referenced fabrication processes; the depicted site is an integral portion of a larger wafer, as indicated by the phantom lines.

For the discrete slab site in FIG. 4, the depression has a rectangular configuration bordered by two parallel ridges;

for other devices, other configurations for the depression and for the ridges may be used. The depression, which is formed by the etching process, also creates a step of I-g-Si between the first plane 191 and the second plane 192; preferably, the step is inclined less than 90°, and more preferably, the step forms a gradual slope 401 between the first and the second I-g-Si surface so that an uninterrupted metal layer can easily be deposited on slope 401.

In the process flow leading up to the packaged transistor device of FIG. 2, the flow starts by providing a wafer of undoped or weakly doped I-g-Si, which includes a plurality of slab sites 210. Each site is configured into ridges with a top in a first plane 290 and a depression framed by the ridges. The depression includes a recessed central area in a second plane 291 spaced from the first plane by a depth 112. A second insulating layer 136 is formed on the second silicon surface; layer 136 covers all slab sites (process 905). While other techniques are possible, preferably the second insulating layer is thermally grown so that the silicon dioxide of the second layer 136 merges with the left-over silicon dioxide of the first layer 133.

Next, at least one layer 231 of metal is deposited onto the second insulating layer 136, covering all slab sites (process 906). Preferably, first a layer of a refractory metal such as titanium is selected, followed by a compound layer such as titanium nitride. Alternative choices include a layer of tungsten, or titanium-tungsten, or another refractory metal. The refractory metal adheres strongly to insulating layer 136. Then, a layer 232 of aluminum is deposited onto the refractory metal layer; layer 232 is preferably thicker than layer 231. For some applications, it is preferred to deposit a layer of nickel and a thin layer of gold (both layers designated 233 in FIG. 2) on top or the aluminum layer 232 in order to facilitate the attachment of transistor terminals.

Next, the metal layers 231 and 232 (and 233) are patterned at each slab site (process 907). FIG. 4 gives an overview of the patterned metal pads of a discrete slab. On the ridges, system terminals are formed, and in the central site portion, pads for transistor terminals (or for other device terminals) are created, which are grouped in an inner set and a peripheral set.

On the ridges for the example shown in FIG. 4, metal layers 120 are destined to be system terminals for the switch node of a power block; metal layer 121 will be the terminal for the gate of the high-side FET; and layer 122 will be system terminal of the drain of the high-side FET tied to the input supply $V_{IN}$ of the system. In the central site portion of the example of FIG. 4, the result of the patterning is a plurality of pads grouped in an inner and a peripheral set, matching the terminals of transistors. The pads of the inner set include pad 411 for the drain terminal 211 of the high-side FET (ending as terminal 122 on the ridge) and pad 413 for the gate terminal 213 of the high-side FET (ending as terminal 121 on the ridge). The pads of the peripheral set include pads 420 for the switch node terminal (ending as terminals 120 on the ridges).

After the patterning, a layer 205 of passivation material such as silicon nitride is deposited onto the patterned metal layer, covering all slab sites (process 908). Passivation layer 237 is then removed, at each slab site, from the terminals on the ridges and from the pads in the central portion in order to expose the underlying metal; on the other hand, the passivation material over the slopes and between the pads is left un-removed.

In the next process, a plurality of first semiconductor chips 101 is provided (process 909). The chips have a flat first side 101b and an opposite flat second side 101d, and a second thickness 101a smaller than the first thickness 130a of the I-g-Si slab. The first chips may include transistors with terminals on the first and the second chip side. For the example of FIG. 5A, the chips are shaped as a hexahedron and made of single-crystalline silicon. The chips may include a FET with a source terminal on the first chip side and a drain terminal 211 and a gate terminal 213 on the opposite second chip side. For other systems, chip 101 may include a bipolar transistor, or it may have different terminal distribution, or chip 101 may be made of gallium arsenide, gallium nitride, or any other semiconductor single crystalline compound.

Figure 5:
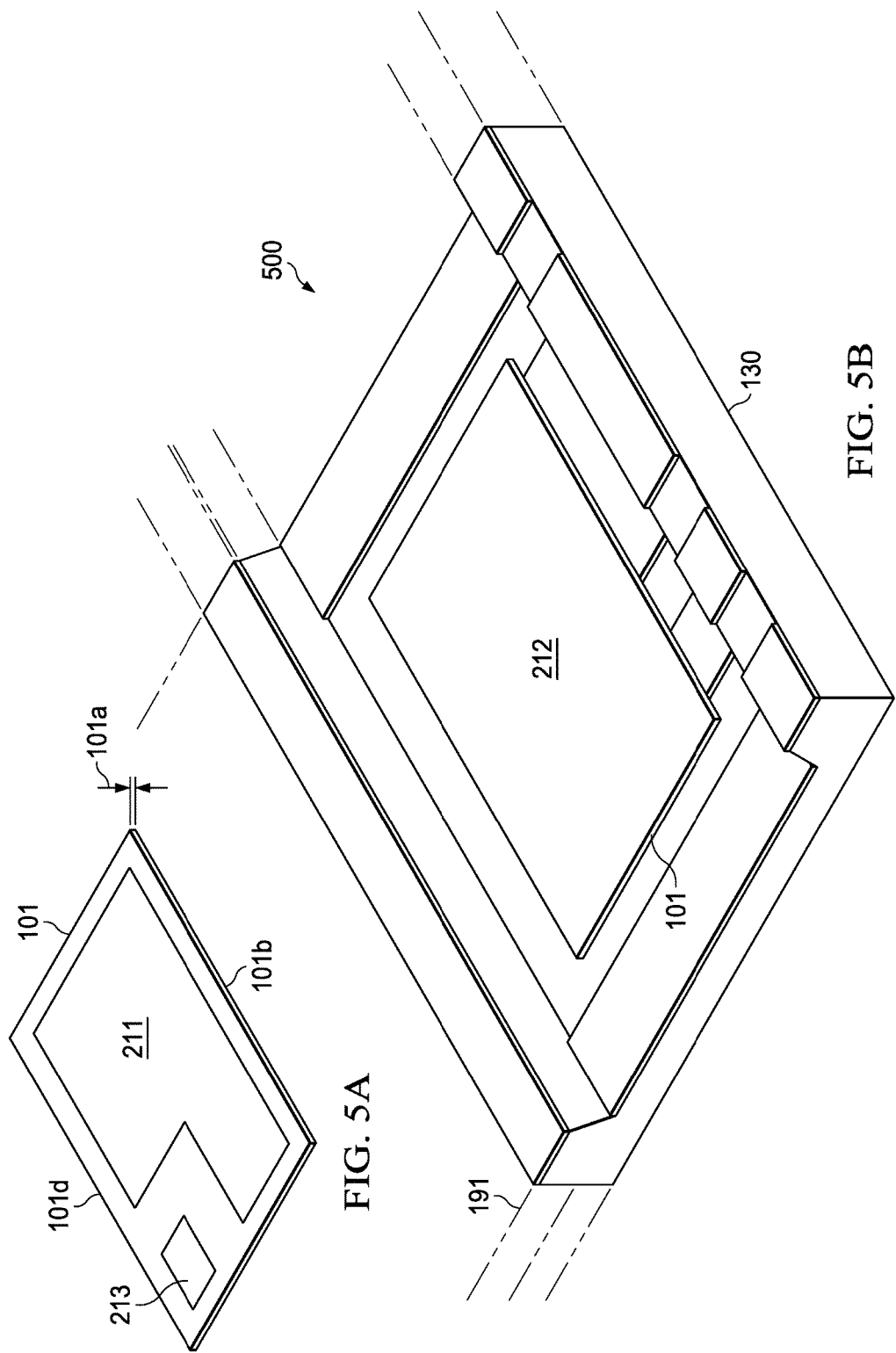
FIG. 5A shows a perspective view of the metal terminals of a MOSFET chip used in assembling a power block
FIG. 5B depicts a perspective view of a site of an I-g-Si wafer after etching a depression and depositing and patterning metal layers matching the FET terminals of the chip of FIG. 5A.

Next, the terminals of the first side of first chips 101 are attached to respective pads of the inner set of the central area of each slab 130 of the I-g-Si wafer (process 910). The preferred attach material is a conductive paste, which includes an adhesive polymeric compound. FIG. 5B depicts an exemplary slab site after the attachment, which creates sub-assemblies designated 500 in FIG. 5B. In the subassembly, the terminals 212 of the second side of the first chip face towards the first plane 191. In the example of FIG. 5B, terminal 212 represents the source terminal of the FET of the first chip.

Figure 6:
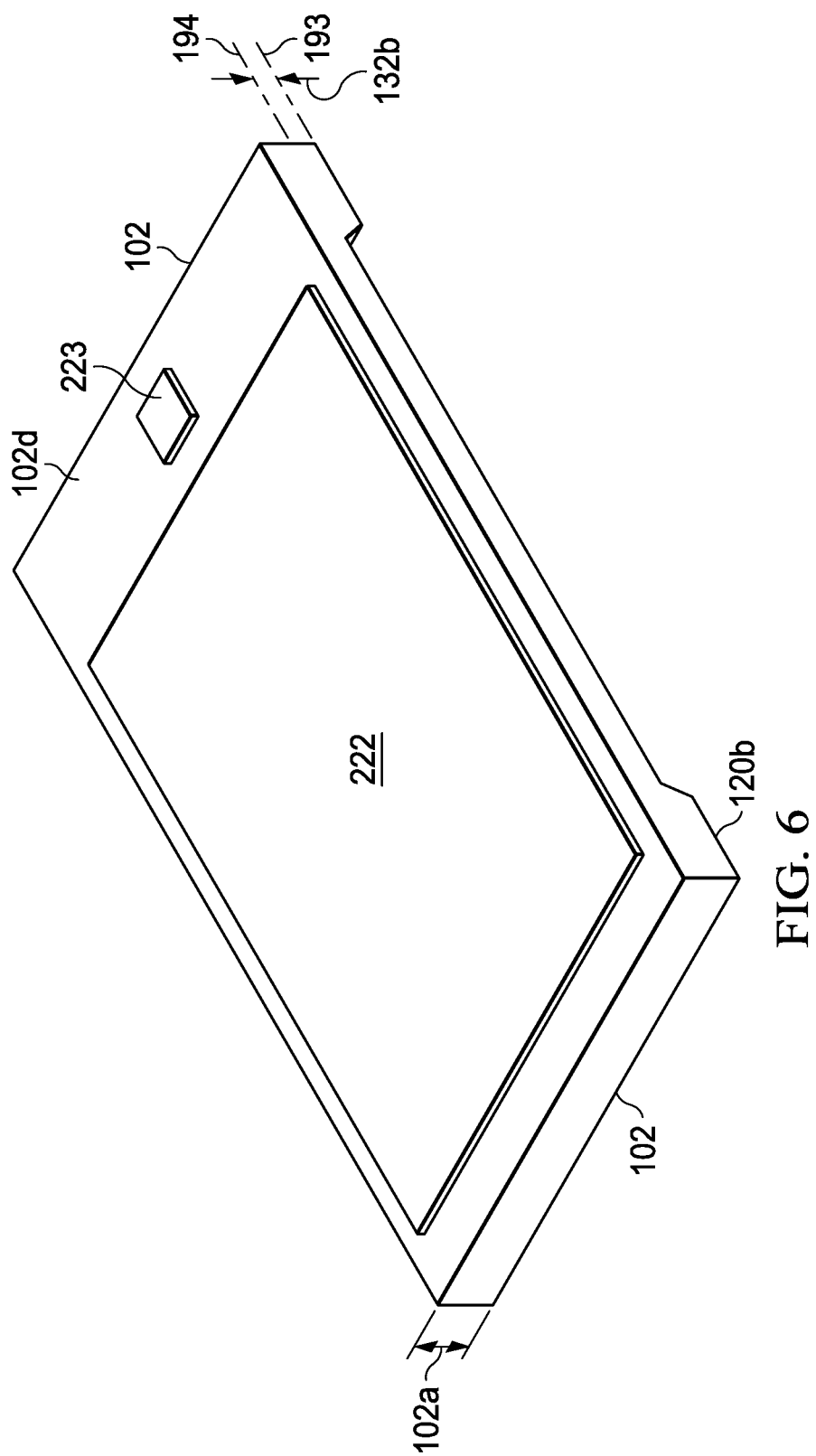
FIG. 6 illustrates a perspective view of a single-crystalline silicon chip with a depression etched into one chip side before fabricating a FET with terminals into the chip.

In the next process, shown in FIG. 6, a plurality of second semiconductor chips 102 is provided (process 911). Second chips 102 have a flat third side 102d and an opposite contoured fourth side 102b, and a third thickness 102a smaller than the first thickness but greater than the second thickness 101a. The fourth side 102b is configured as a ridge, or retaining wall, in a third plane 193 framing a depression including a flat central area in a parallel fourth plane 194 recessed from the third plane by a second depth 132b. Second depth 132b is configured to be smaller than the first depth 132a of a slab, and suitable to accommodate a first chip 101.

Second chips 102 are made of a single crystalline semiconductor, frequently silicon, which is heavily doped and makes good contact to the uniform metal layer covering the fourth side 102b. In addition, chips 102 include an epitaxial layer suitable for forming active devices such as FETs or bipolar transistors. In the example of FIG. 6, the transistor is an FET with a source terminal 222 and a gate terminal 223 on the third side 102d, and a drain terminal on the fourth side 102b.

Figure 7:
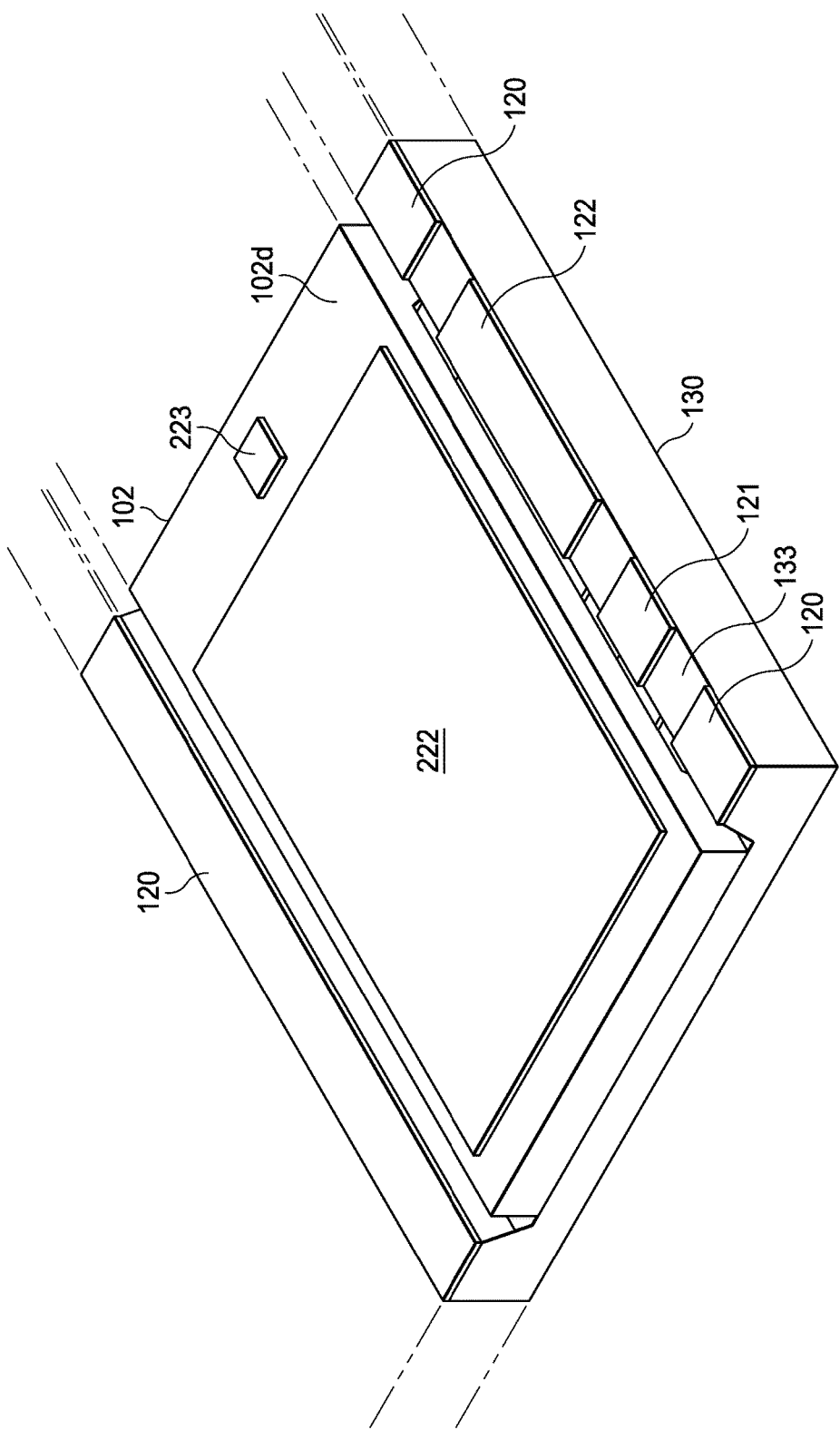
FIG. 7 shows a perspective view of an assembled power block with stacked silicon MOS FETs flip-attached to and embedded in a I-g-Si slab operating as package.

FIG. 7 illustrates the assembly of a second chip 102 with a subassembly 500 of FIG. 5B (process 912). In this process, the metallized depressed central area of the fourth side 102b of a second chip 102 is attached to the terminals on the second side 101b of the respective first chip 101, and the metallized ridges of the second chip 102 are attached to the pads of the respective peripheral set of the central I-g-Si area. In this assembly process, the transistor terminals 222 and 223 on the third side 102d of the second chips become co-planar with the terminals 120, 121, and 122 on the ridges of the respective l-g-Si slab 130. All attachment processes are preferably performed using a conductive paste of an adhesive polymeric compound; alternatively, they may be performed using a lead-free solder. The co-planarity of all system terminals facilitates the assembly of the system onto external boards.

After the chips have been assembled in the depressions of the sites of the wafer, the I-g-Si wafer is cut by saws or laser into singulated systems, as depicted in FIG. 1 (process 913).

The electronic system with stacked semiconductor chips embedded in a silicon package offers numerous technical advantages. Compared to conventional systems, are plurality of parts are now eliminated, all of which are costly, labor-intensive in manufacturing, and parasitic in electrical parameters: Bonding wires, connecting clips, metallic leadframes, plastic molding compounds, and solders with lead. Thermal performance is greatly improved by low theta parameters to case, to top, to ambient, and heat sinks. The ratio of active silicon versus package is high, and the overall system thickness can be kept very thin (about 0.3 to 0.5 mm). Differences between the coefficients of thermal expansion of chips and package are minimized or eliminated; thermo-mechanical stresses are thus minimized.

Other embodiments of the invention are electronic systems such as a DC-DC power converter, often referred to as synchronous Buck converter. The exemplary converter depicted in FIG. 8 includes a vertical stack of two FET chips, embedded into each other, and an adjacent driver-and-controller chip assembled on a I-g-Si container formed as a slab with retaining walls. The exemplary system has a length 801 of 5.0 mm, a width 802 of 3.0 mm, and a height 803 of 0.45 mm. All metal terminals and the silicon back side 810a of the driver-and-controller chip 810 are co-planar; the common plane is designated 191. Adopting and expanding the designations employed in FIGS. 1 and 7, FIG. 8 shows both the power block 110 with the embedded FETs and the flipped driver-and-controller chip 810 attached to slab 130. In the example of FIG. 8, metal layer 222 is the source terminal and layer 223 the gate terminal of the low-side FET (sync FET), metal layer 122 is the drain terminal of the high-side FET, electrically tied to the input supply $V_{IN}$, layer 121 is the gate terminals of the high-side FET, layers 120 are the terminals of the switch node, and metal layers 811, 812, 813, 814, 815, and 816 are the output pins of the integrated driver-and-controller circuit of flipped chip 810. The exposed silicon surface 810a may be metallized to facilitate the attachment to an external board.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, to bipolar transistors, insulated gate transistors, thyristors, and others.

As another example, the above considerations for structure and fabrication method of power converters apply to regulators, multi-output power converters, applications with sensing terminals, applications with Kelvin terminals, and others.

As another example, the high current capability of the packaged transistors and converter can be further extended, and the efficiency further enhanced, by using the blank backside of the I-g-Si, after attachment of the devices to a board, so that the back side can be connected to a heat sink, preferably. In this configuration, the device can dissipate its heat into the board as well as into the heat sink.

It is therefore intended that the appended claims encompass any such modifications or embodiments.

We claim:
1. An electronic system comprising:
   a first chip of a single-crystalline semiconductor, the first chip including a first source terminal and a first gate terminal on one side and a first drain terminal on an opposite side;
   a second chip of a single-crystalline semiconductor, the second chip including a second source terminal on one side and a second drain terminal and a second gate terminal on an opposite second side;

the first chip attached to the second chip, wherein the first drain terminal attaches to the second source terminal; and the second drain and second gate terminals attached to a container, the container having a slab bordered by retaining walls.

2. The system of claim 1, wherein the first drain terminal is directly attached to the second source terminal.

3. The system of claim 1, wherein the second drain and second gate terminals are directly attached to the container.

4. The system of claim 1, wherein the container is of silicon.

5. The system of claim 1, wherein the retaining walls are a plurality of ridges.

6. The system of claim 1, wherein the single-crystal semiconductor is silicon, the first and the second chips are MOS field-effect transistors, and the electronic system is a power block.

7. The system of claim 1, wherein the electronic system is a regulator.

8. The system of claim 4, wherein the silicon is selected from a group consisting of reclaimed silicon, unrefined silicon, undoped silicon, polycrystalline silicon, intrinsic polycrystalline silicon, doped n-type polycrystalline silicon, and doped p-type polycrystalline silicon.

9. The system of claim 1, wherein the first chip is shaped as a hexahedron.

10. The system of claim 1, wherein slab has a thickness of 300 μm, a length of 5.8 mm, and a width of 3.7 mm.

11. An electronic system comprising:

a first chip of a single-crystalline semiconductor, the first chip including a first source terminal and a first gate terminal on one side and a first drain terminal on an opposite side;

a second chip of a single-crystalline semiconductor, the second chip including a second source terminal on one side and a second drain terminal and a second gate terminal on an opposite second side, the second chip having a slab bordered by retaining walls, wherein the second drain terminal is on the slab of the second chip;

the first chip attached to the second chip, wherein the first drain terminal attaches to the second source terminal; and the second drain and second gate terminals attached to a container, the container having a slab bordered by retaining walls.

12. The system of claim 11, wherein the first chip includes a first electronic device, and the second chip includes a second electronic device.

13. The system of claim 11 further comprising a third chip directly attached to the slab of the container, the third chip including a third electronic device.

14. The system of claim 13, wherein the single-crystal semiconductor is silicon, the first and the second electronic devices are MOS field-effect transistors, the third electronic device is an integrated circuit, and the electronic system is a power converter.

15. A packaged electronic system comprising:

a slab of silicon having a first thickness and a surface in a first plane, the slab configured as a ridge in the first plane framing a depression including a recessed central area in a second plane spaced from the first plane by a first depth, the ridge and the central area covered by a metal layer patterned into pads, the pads of the central area grouped into an inner set and a peripheral set;

a first semiconductor chip having a first and an opposite second side, and a second thickness smaller than the first thickness, the first semiconductor chip including a transistor having terminals on the first and the second side, the terminals of the first side attached to respective pads of the inner set of the central area of the slab, creating a sub-assembly wherein the terminals of the second semiconductor chip side face towards the first plane;

a second semiconductor chip having a third and an opposite fourth side, and a third thickness smaller than the first thickness but greater than the second thickness, the fourth side configured as a ridge in a third plane framing a depression including a central area in a parallel fourth plane recessed from the third plane by a second depth smaller than the first depth and suitable to accommodate the first semiconductor chip, the fourth side metallized, the second semiconductor chip including a transistor having terminals on the third and the fourth side; and the depression of the fourth side attached to the terminals on the second side of the first chip, and the ridge of the second chip attached to the peripheral set.

16. The device of claim 15, wherein the transistors of the first and the second semiconductor chips are MOS field-effect transistors and the electronic system is a power block.

17. The device of claim 15, wherein the transistors of the first and the second semiconductor chips are bipolar transistors and the electronic system is a regulator.

* * * * *